(12) United States Patent
Sakaguchi

(10) Patent No.: US 6,996,489 B2
(45) Date of Patent: Feb. 7, 2006

US006996489B2

(54) METHOD AND APPARATUS FOR SAMPLING A POWER SUPPLY CURRENT OF AN INTEGRATED CIRCUIT, AND STORAGE MEDIUM ONTO WHICH IS RECORDED A CONTROL PROGRAM THEREFOR

(75) Inventor: Kazuhiro Sakaguchi, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 908 days.

(21) Appl. No.: 09/796,451

(22) Filed: Mar. 2, 2001

(65) Prior Publication Data

US 2001/0020283 A1 Sep. 6, 2001

(30) Foreign Application Priority Data

Mar. 3, 2000 (JP) .................................... 2000-059090

(51) Int. Cl.
    G01R 31/28         (2006.01)

(52) U.S. Cl. ....................... 702/110; 324/527; 714/733
(58) Field of Classification Search ................ 324/527, 324/763–765; 702/76–78, 81–84, 109, 110, 702/117, 130; 714/733–736, 738
    See application file for complete search history.

(56) References Cited

U.S. PATENT DOCUMENTS

| 5,629,870 | A | * | 5/1997 | Farag et al. ................ 700/286 |
| 5,661,520 | A |   | 8/1997 | Bruce ........................... 348/92 |
| 5,784,233 | A | * | 7/1998 | Bastard et al. .............. 361/36 |
| 6,351,835 | B1 |  | 2/2002 | Sakaguchi |
| 6,766,485 | B1 | * | 7/2004 | Sakaguchi ................. 714/724 |
| 2004/0051549 | A1 | * | 3/2004 | Matsuzaki et al. .......... 324/763 |

FOREIGN PATENT DOCUMENTS

| JP | 5-315424 | 11/1993 |
| JP | 7-280880 | 10/1995 |
| JP | 2734416 | 1/1998 |
| JP | 2783243 | 5/1998 |
| JP | 11-142468 | 5/1999 |
| JP | 2962283 | 8/1999 |
| JP | 2000-46899 | 2/2000 |

OTHER PUBLICATIONS

"Microsoft Press Computer Dictionary, Second Edition", 1993, Microsoft Press, p. 174.*
Sakaguchi, K. et al., "Fast Fault Detection by Analyzing the Power Spectrum of Supply Current" SEMI Technology Symposium 98:3-77 to 3-83.

* cited by examiner

*Primary Examiner*—Marc S. Hoff
*Assistant Examiner*—Craig Steven Miller
(74) *Attorney, Agent, or Firm*—Foley & Lardner LLP

(57) ABSTRACT

An apparatus for sampling a power supply current value for performing frequency analysis of the power supply current flowing in an integrated circuit with a test signal applied to the integrated circuit has a power supply generating a prescribed supply of power for the integrated circuit (DUT: device under test), a current detection means for observing the power supply current value supplied from the power supply to the DUT, a test signal generation means for generating a prescribed test signal to be applied to an input/output terminal other than a power supply terminal of the DUT and for generating a test signal application signal during application of the test signal to the DUT, a sampling means for sampling the power supply current value signal, a sampling time determining means for instructing the sampling means with regard to the start and end timing for sampling, based on the test signal application signal, a sampling data storage means for storing data sampled by the sampling means, a Fourier transform means for performing a Fourier transformation calculation on the sampled data, and a main control means for outputting instructions to various other means and performing overall apparatus control.

29 Claims, 9 Drawing Sheets

METHOD AND APPARATUS FOR SAMPLING A POWER SUPPLY CURRENT OF AN INTEGRATED CIRCUIT, AND STORAGE MEDIUM ONTO WHICH IS RECORDED A CONTROL PROGRAM THEREFOR

BACKGROUND OF THE INVENTION

1. Field of the Invention

The present invention relates to test technology for an integrated circuit, and more particularly to a method and apparatus for sampling a power supply current for performing frequency analysis of the power supply current flowing in the integrated circuit when a test signal is applied thereto, and to a storage medium onto which is stored a control program for controlling the sampling apparatus.

2. Related Art

A method such as noted above of sampling the power supply current of an integrated circuit was used in the past in order to perform frequency spectrum analysis of the power supply current of the integrated circuit.

For example, as noted in a paper titled "Fast Fault Detection by Analyzing the Power Spectrum of Supply Current" by Kazuhiro Sakaguchi and Shigehiro Kamimura SEMI Technology Symposium 98, 3-77 to 3-83, there is a method for sampling the power supply current for the purpose of determining the frequency spectrum of the power supply current.

In the method described in the above-noted reference, sampling of the power supply current is performed while applying a test pattern to an integrated circuit.

In the method described in the above-noted reference, however, there is a problem that there exists a possibility that the power supply current information for the power supply current flowing in the integrated circuit under test (DUT; device under test) is not completely obtained.

The reason for this is that the circuits forming the power supply or current measurement unit and the device under test have capacitive components and inductive components, so that even if the application of the test pattern is ended, power supply current continues to flow for an amount of time established by the time constant of the circuit.

For this reason, in order to obtain complete information with regard to the power supply current related to the operation of a device under test to which a test pattern is applied, it is necessary, simultaneously with the completion of application of the test pattern, to not stop the sampling of the power supply current, but rather to continue the sampling for some time thereafter.

Accordingly, it is an object of the present invention, in consideration of the above-described drawback in the prior art, to provide a method and apparatus for sampling a power supply current of an integrated circuit, which obtains all complete information with regard to a power supply current flowing in an integrated circuit when a test pattern is applied to the integrated circuit, and to provide a storage medium onto which is stored an associated control program for executing this sampling method.

SUMMARY OF THE INVENTION

To achieve the above-noted objects, the present invention adopts the following basic technical constitution.

Specifically, the present invention is an apparatus for sampling a power supply current for performing frequency analysis of the power supply current flowing in an integrated circuit to which is applied a test signal, this apparatus having a power supply generating a prescribed supply of power to a power supply terminal of a device under test (DUT), a current detection means for monitoring a power supply current value supplied from the power supply to the DUT and generating a power supply current value signal indicating this value, a test signal generating means for generating a prescribed test signal to be applied to input/output terminals of the DUT other than the power supply terminal and for generating a test signal application signal indicating that the test signal is currently being applied, a sampling means for sampling the power supply current value signal, a sampling time determination means for instructing the sampling means with regard to the start and end of sampling, based on the test signal application signal, a sampled data storage means for storing data sampled by the sampling means, a Fourier transform means for performing a Fourier transformation on the sampled data, and a control means for issuing instructions to various means and for controlling the overall apparatus.

The present invention has a time constant information storage means for holding time constant information of the circuit and the sampling time determination means, which indicates to the sampling means, based on the test signal application signal and the time constant information of the time constant information storage means, a time of the start and the end of sampling apparatus.

The present invention can further have a configuration including a sampled data analysis means which performs analysis of sampled data and establishes the amount of continuation time during which sampling of the power supply current value signal is to be continued after the end of application of the test signal to the DUT.

The present invention can further have a configuration including a stabilization judgment means, which, based on the sampled data, makes a judgments as to how much time would be required after the end of application of the test signal to the DUT until a time at which the power supply current stops or stabilizes, and determines the extension time for sampling.

The present invention can further have a configuration including a Fourier transform window information storage means, which stores a range of data of the sampled data to be subjected to a Fourier transformation calculation.

The present invention can further have a configuration including a time constant information storage means storing and holding circuit time constant information and a Fourier transform window determination means, which, based on the time constant information, determines a range of data of the sampled data to be subjected to a Fourier transformation calculation.

The present invention can further have a configuration including a sampled data analysis means analyzing the sampled data and a Fourier transform window determination means, which, from the sampled data analysis results thereof, determines a range of data of the sample data to be subjected to a Fourier transformation calculation.

The present invention can further have a configuration including a stabilization judgment means, which judges approximately how much time would be required after the end of application of the test signal to the DUT until a time when the power supply current stops or stabilizes, and a Fourier transform window determination means, which, from the results from the stabilization judgment means, determines a range of data of the sampled data to be subjected to a Fourier transformation calculation.

The present invention is embodied as follows. An apparatus for sampling the power supply current of an integrated circuit according to an embodiment of the present invention is an apparatus that samples a value of power supply current flowing in the integrated circuit when a test signal is applied to the integrated circuit, wherein sampling of the power supply current is not only performed during the time when the test signal is applied to the integrated circuit, but is also continued after the end of application of the test signal, this apparatus having a test signal generation means (reference numeral 2 in FIG. 1 of the accompanying drawings), which generates a test signal, a device under test (DUT; reference numeral 1 in FIG. 1), a power supply (reference numeral 5 in FIG. 1) which supplies a prescribed power to the integrated circuit, a current detection means (reference numeral 4 in FIG. 1), which detects a value of the power supply current supplied to the integrated circuit from the power supply, a sampling means (reference numeral 7 in FIG. 1), which sampling the power supply current value detected by the power supply current detection means, a sampling time determination means (reference numeral 6 in FIG. 1), which instructs the sampling means with regard to the start and end of sampling, a sampled data storage means (reference numeral 8 in FIG. 1), which holds values of sampled data, a Fourier transform means (reference numeral 9 in FIG. 1), which performs a Fourier transformation on values of sampled data, and a control means (reference numeral 1 in FIG. 1), which controls the overall apparatus.

A method for sampling a power supply current of an integrated circuit according to an embodiment of the present invention is a method for sampling the power supply current flowing in the integrated circuit when a test signal is applied to the integrated circuit, this method not only sampling the power supply current during the time when the test signal is applied to the integrated circuit, but also continuing to sample the power supply current value even after the end of application of the test signal to the integrated circuit, the method being formed by generating a prescribed power supply voltage for the integrated circuit and supplying the, voltage to the integrated circuit (step S101 of FIG. 9 of the accompanying drawings), generating a test signal to be applied to the integrated circuit and supplying the test signal to the integrated circuit (stepS102 in FIG. 9), generating a test signal application signal indicating that the test signal is applied (step S103 of FIG. 9), monitoring the power supply current value flowing in the integrated circuit and generating a power supply current value signal (step S104 of FIG. 9), starting sampling of the power supply current value signal (step S105 of FIG. 9), ending the generation of a the test signal upon generation and application of a pre-established test signal (step S106 of FIG. 9), determining the time of ending the sampling of the power supply current value signal (step S107 of FIG. 9), stopping the sampling of the power supply current value signal (step S108 of FIG. 9), performing a Fourier transform processing on sampled data (step S109 of FIG. 9), and stopping the supply of power (step S110 of FIG. 9).

A storage medium according to the present invention is a storage medium onto which is stored a program for execution under computer control of processing for sampling of a power supply current value for frequency analysis of the power supply current flowing in an integrated circuit when a test signal is applied to the integrated circuit by a power supply current sampling apparatus, this processing being:

(a) processing for causing a prescribed voltage to be generated by a power supply and supplied to power supply terminal of a DUT;

(b) processing for causing a current detection means to monitor a size of power supply current supplied to the DUT from the power supply and generate a power supply current value signal indicating that value;

(c) processing for causing a test signal generation means to generate a prescribed test signal and apply this test signal to an input/output terminal of the DUT, and causing generation of a test signal application signal indicating that the test signal is currently being applied;

(d) processing for determining a timing to start and to end a sampling operation of the power supply current value signal from the test signal application signal, and instructing the determination to a sampling means;

(e) processing for causing the sampling means to execute sampling of the power supply current value signal based on timing of the start and end of sampling;

(f) processing for causing the storage into a sampled data storage means of sampled data of the power supply current value signal obtained by the above-noted sampling; and (g) processing for causing a Fourier transform means to perform a Fourier transformation processing with respect to sampled data, and to determine a frequency spectrum of the power supply current.

In this embodiment of the present invention, the program can be read into the computer from the storage medium (for example, CD-ROM, DVD, floppy disk, hard disk, magnetic tape, or semiconductor memory) into which the above-noted program is stored and then executed, or downloaded to the computer from a communication network, via a server or the like and then executed.

A method for sampling the value of power supply current flowing in an integrated circuit when a test signal is applied to the integrated circuit according to the present invention not only samples the power supply current value during the time when a test signal is applied to the integrated circuit, but also continues to sample the power supply current value after the end of application of the test signal, thereby obtaining complete information with regard to the power supply current value.

More specifically, a power supply generates prescribed power for an integrated circuit, and supplies this power to the integrated circuit. The test signal generation means generates a test signal for application to the integrated circuit, and applies the test signal to the integrated circuit, and also generates a test signal application signal that indicates that the test signal is currently value being applied. A current monitoring means monitors the power supply current flowing in the integrated circuit and generates a power supply current value signal, which is sampled by the sampling means.

When the above is done, the timing of the start and end of sampling are controlled so that the timing starts with the start of application of the test signal, as indicated by the test signal application signal, and ends when a prescribed amount of time has elapsed after the end of the test signal application. This timing of the start and end of sampling is established by the sampling time determination means.

The sampled data are first stored in the sampled data storage means, after which a frequency spectrum is ultimately obtained by the Fourier transform means. According to this configuration, in accordance with the time constants existing in the power supply, the current detection means, and the integrated circuit, power supply current information with regard to current flowing even after the end of application of the test signal is obtained.

DETAILED DESCRIPTION OF THE PREFERRED EMBODIMENTS

Embodiments of the present invention are described in detail below, with references made to relevant accompanying drawings.

Figure 1:
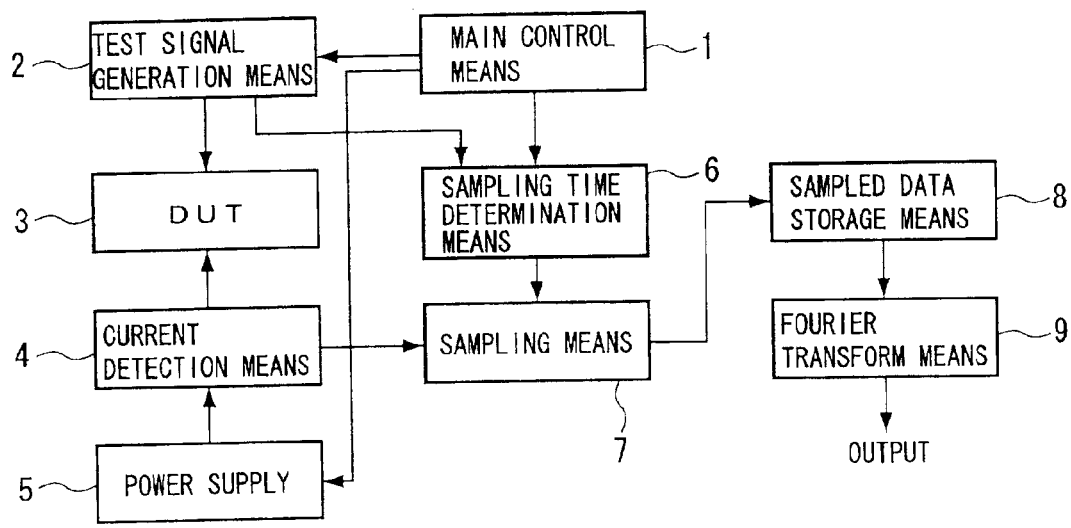
FIG. 1 is drawing showing a first embodiment of the present invention.

FIG. 1 is a drawing showing the configuration of a first embodiment of the present invention. Referring to FIG. 1, the sampling apparatus according to the first embodiment of the present invention has a main control means 1, a test signal generation means 2, a device under test (DUT) 3, a current detection means 4, a power supply 5, a sampling time determination means 6, a sampling means 7, a sampled data storage means 8, and a Fourier transform means 9.

The test signal generation means 2, in response to an instruction from the main control means 1, generates a pre-established test signal, and applies the test signal to prescribed input/output terminals, exclusive of power supply terminals, of the device under test (DUT) 3. During the time in which the test signal is applied to the DUT 3, the test signal generation means 2 generates a test signal application signal indicating that the test signal is currently being applied.

The power supply 5, in response to an instruction from the main control means 1, generates a prescribed voltage, and supplies this voltage to the DUT 3, via the current detection means 4.

The current detection means 4 monitors the power supply current supplied to the DUT 3, generates a signal (the power supply current value signal) indicating this value, and transmits this to the sampling means 7.

The sampling time determination means 6, in response to an instruction from the main control means 1 and based on test signal application signal from the test signal generation means 2 indicating application of the test signal, instructs the sampling means 7 with regard to the start and end of sampling of the power supply current value signal.

The sampled power supply current value signal is sent to and stored in the sampled data storage means 8.

The Fourier transform means 9 executes a discrete Fourier transformation (or fast Fourier transformation (FFT)) on the sampled data stored in the sampled data storage means 8, and outputs a frequency spectrum of the power supply current.

The main control means 1 outputs instructions to the various other means, and controls the overall operation of the apparatus.

Figure 9:
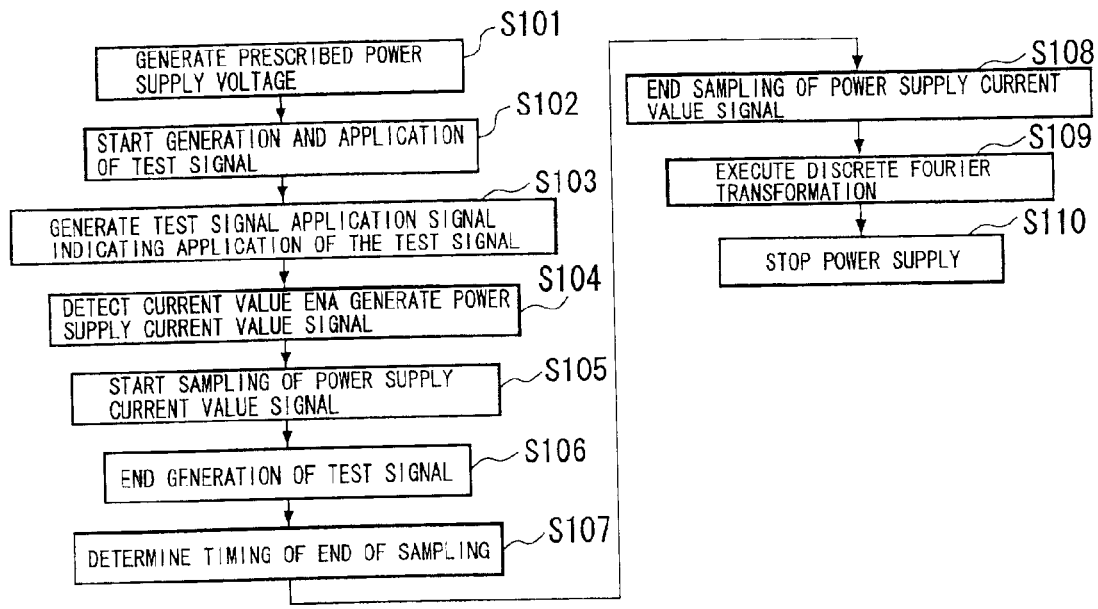
FIG. 9 is a flowchart showing the operation of the first embodiment of the present invention.
Figure 10:
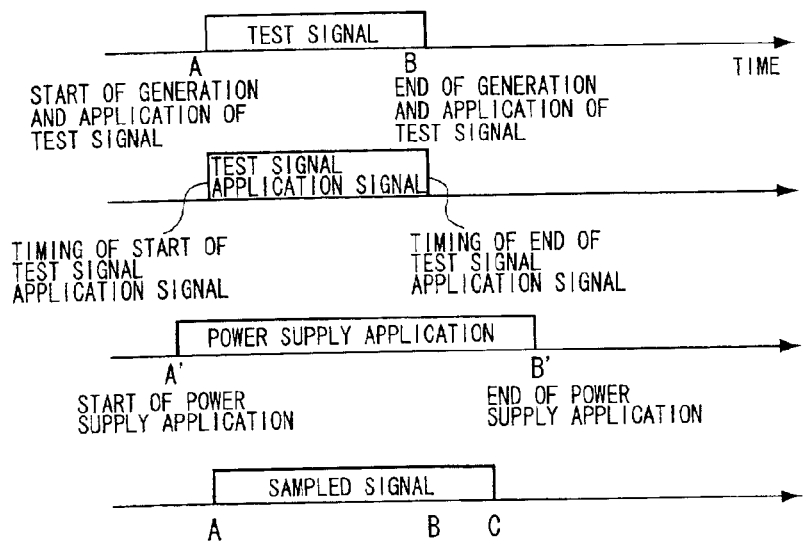
FIG. 10 is a drawing illustrating the operation of the first embodiment of the present invention.
Figure 11:
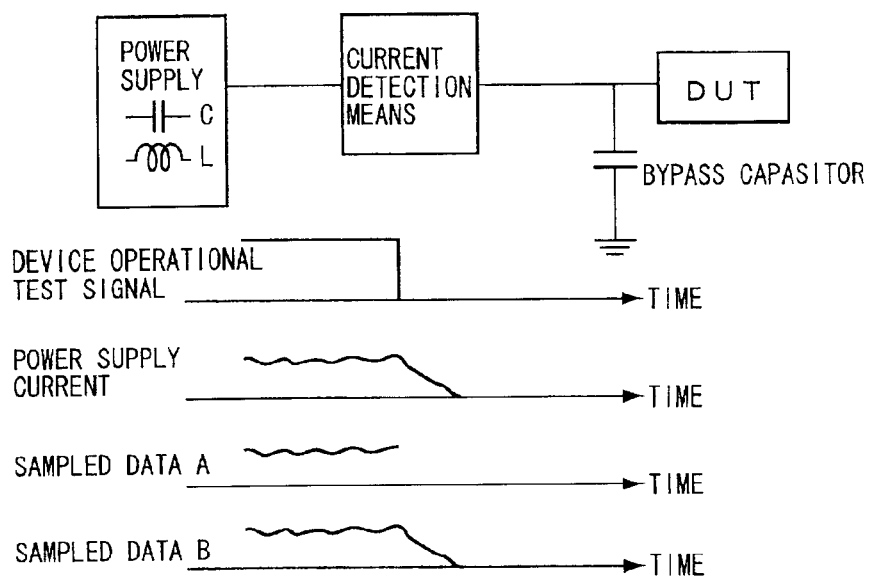
FIG. 11 is a drawing illustrating the operation of the first embodiment of the present invention.

FIG. 9 is a flowchart illustrating the operation of the first embodiment of the present invention, and FIG. 10 is a drawing illustrating the operation of the first embodiment. The operation of the first embodiment is described in detail below, with references made to FIG. 1, FIG. 9, and FIG. 10.

At the time A' shown in FIG. 10, an instruction from the main control means 1 causes the power supply 5 to generate a pre-established voltage, this power supply voltage being applied to a power supply terminal of the DUT 3 via the current detection means 4 (step S101 in FIG. 9). This power supply voltage is not restricted to a constant voltage, and can alternatively be a voltage that changes with time.

At the time A the test signal generation means 2 starts to generate a pre-established test signal in response to an instruction from the main control means 1, this test signal being applied to input/output terminals other than a power supply terminal of the DUT 3 (step S102 of FIG. 9).

At the test signal generation means 2, upon the start of application of the test signal a test signal application signal indicating that the test signal is being applied is generated, this being transmitted to the sampling time determination means 6 (step S103 in FIG. 9).

At the current detection means 4, the current generated by the power supply 5 and supplied to the DUT 3 is constantly monitored and a power supply current value signal indicating the size of this current value is generated, this being transmitted to the sampling means 7 (step S104 in FIG. 9).

At the sampling time determination means 6, upon receiving the test signal application signal from the test signal generation means 2, simultaneously with start of the application of the test signal, an instruction is given to the sampling means 7 for the start of sampling of the power supply current value signal.

At the sampling means 7, in accordance with a sampling start instruction the sampling of the power supply current value signal is started (time A in FIG. 10), and sampled values are successively sent to the sampled data storage means 8 (step S105 in FIG. 9).

At the time B (FIG. 10), the test signal generation means 2 ends generation of the test signal and the application of the test signal to the DUT 3 is ended. Upon the end of application of the test signal, the generation of the test signal application signal is also ended (step S106 in FIG. 9).

At the time C, which is at a given time after the time B at which the test signal application ends (FIG. 10), the sampling time determination means 6, in response to the test signal application signal and an instruction from the main control means 1, instructs the sampling means 7 to end sampling (stepS107 in FIG. 9).

Upon receiving the sampling end instruction, the sampling means 7 ends sampling of the power supply current value signal (step S108 in FIG. 9).

By the ending the of the sampling, all of the sampled data from the power supply current value signal during the time from time A to time C (FIG. 10) are completely stored in the sampled data storage means 8.

At the Fourier transform means 9, all the sampled data are subjected to a discrete Fourier transformation, so as to obtain a frequency spectrum of the power supply current value signal. The thus obtained frequency spectrum information is then output (step S109 of FIG. 9).

At the time B' (FIG. 10), the generation of the power supply by the power supply 5 is ended (step S110 in FIG. 9).

It is possible to store the above-described operations as a control program of control operations, and to execute this control program by the main control means 1 so as to perform control of the various sections of the apparatus. In this case, the control program is stored into a storage medium (not shown in the drawing) such as a ROM or floppy disk attached to the main control means 1, this program being then loaded into the main control means.

The operational effect of the first embodiment of the present invention is described below, with reference made to FIG. 1. Because sampling of a power supply current value signal in the past was ended simultaneously with the end of application of the test signal to the DUT 3, the sampled power supply current value signal, as indicated by the sampled data A, was cut off at time B. However, because the circuitry making up the power supply, the current detection means, and the DUT has a bypass capacitors for the purpose of stabilizing the power supply voltage applied to the DUT, capacitance and inductance internal to the power supply and parasitic capacitances and the like, there is a certain time constant in the circuitry. This time constant means that even after the application of the test signal to the DUT is ended (at time B) and the DUT operation stops, there is a power supply current detected by the current detection means, the flow of this current stopping (or stabilizing) when a certain amount of time has elapsed (at time C). For this reason, in order to obtain frequency spectrum information of the power supply current resulting from operation of the DUT with the application of a test signal, it is necessary to sample the power supply current value signal up until the time C and perform a discreet Fourier transformation based on the obtained sampled data, so as to obtain a frequency spectrum of the power supply current.

Given the above requirement, in the first embodiment of the present invention, after the application of the test signal to the DUT is ended, sampling of the power supply current value signal is continued for a certain amount of time, making it possible to obtain an accurate frequency spectrum of the power supply current.

Figure 2:
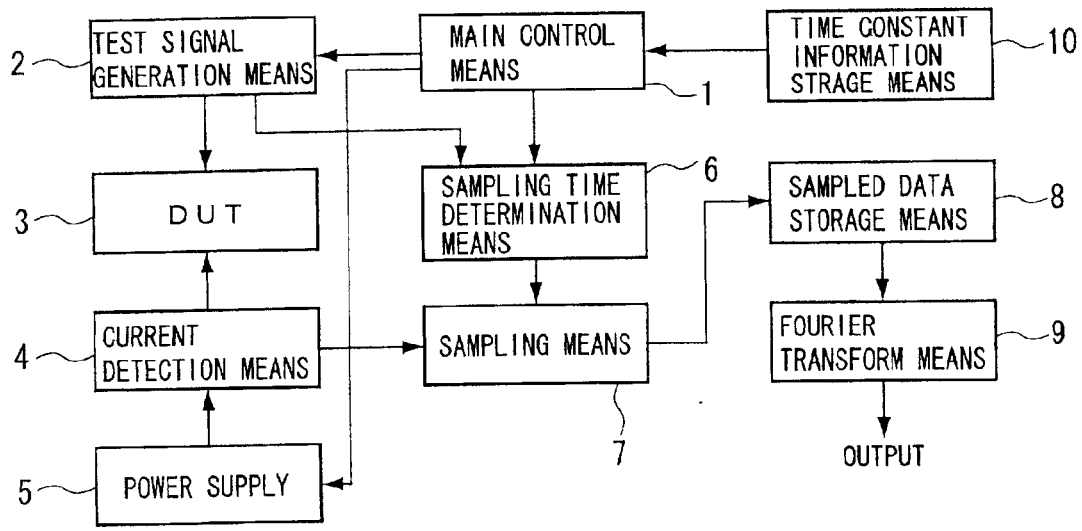
FIG. 2 is drawing showing a second embodiment of the present invention.

A second embodiment of the present invention is described below. FIG. 2 is shows the configuration of the second embodiment. Referring to FIG. 2, it can be seen that the second embodiment, in contrast to the first embodiment, shown in FIG. 1, has the addition of a time constant information storage means 10. The time constant information storage means 10 stores and holds the time constant information of the circuitry forming the power supply 5, the current detection means 4, and the DUT 3, and, in response to an instruction from the main control means 1, sends the time constant information. Other parts of the configuration are the same as the configuration of the first embodiment as shown in FIG. 1.

Figure 12:
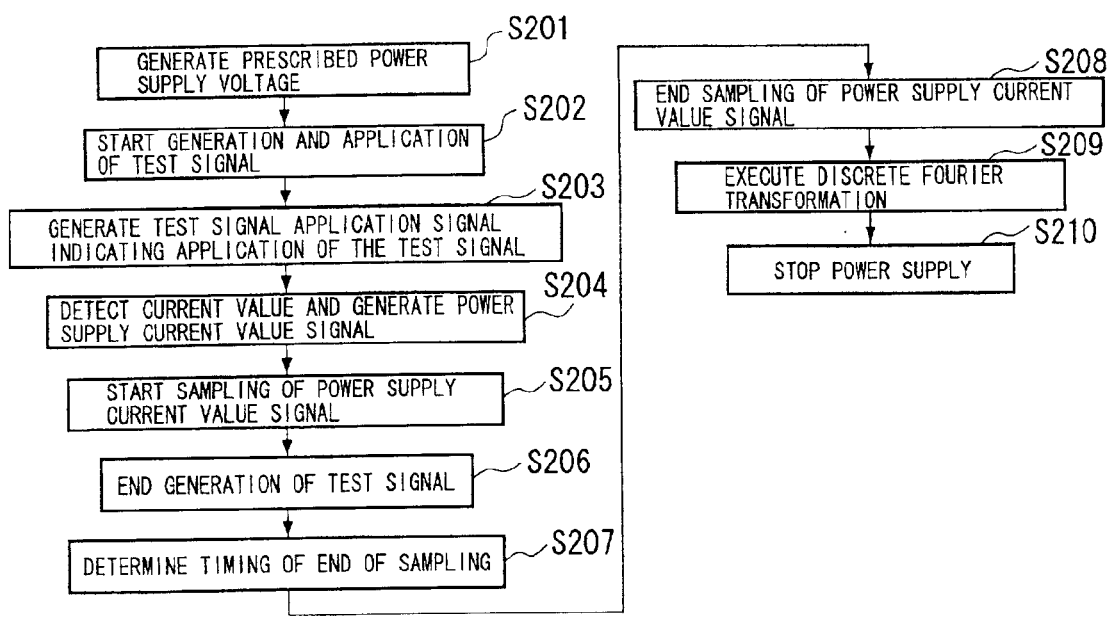
FIG. 12 is a flowchart showing the operation of the second embodiment of the present invention.

FIG. 12 is a flowchart illustrating the operation of the second embodiment. Because steps S201 to S206 and steps S208 to S210 are the same as steps S101 to S106 and steps S108 to S110 described with regard to the first embodiment, these steps will not be described herein.

In the time constant information storage means 10, time constant information of the circuitry forming the power supply 5, the current detection means 4, and the DUT 3 is stored. In the circuitry forming the power supply 5, the current detection means 4, and the DUT 3, with changes in the type of power supply 5 and DUT 3, there is a change in the time constant of the circuitry. For this reason, the time constant is determined for each type of power supply 5, current detection means 4, and DUT 3, and this is stored in the time constant information storage means 10.

In response to an instruction from the main control means 1, the appropriate time constant information is sent to the main control means 1, and the main control means 1 sends this information to the sampling time determination means 6. The sampling time determination means 6, based on the time constant information sent from the main control means 1, establishes the sampling extension time (step S207 in FIG. 12).

This series of operations can be stored as a program of control operations, this control program being then executed by the main control means 1 so as to perform control of the various parts of the apparatus. In this case, the control program is stored into a storage medium (not shown in the drawing), such as a ROM or floppy disk provided in the main control means 1, and loaded into the main control means 1.

The operational effect of the second embodiment of the present invention is described below.

The time constant of the circuitry making up the power supply, the current detection means, and the DUT varies depending on the type of power supply and DUT. Given this situation, the time constant is determined and stored for each DUT, making it possible to immediately obtain the time constant information for each circuit system made up of a power supply, a current detection means, and a DUT. The amount of time required for the power supply current to stop or stabilize after stopping the application of a test signal is determined by the time constant of the circuitry. Because of this, by establishing the time extension of sampling of the power supply current value signal based on the time constant information of the particular circuit, it is possible to easily obtain an accurate frequency spectrum of the power supply current.

Figure 3:
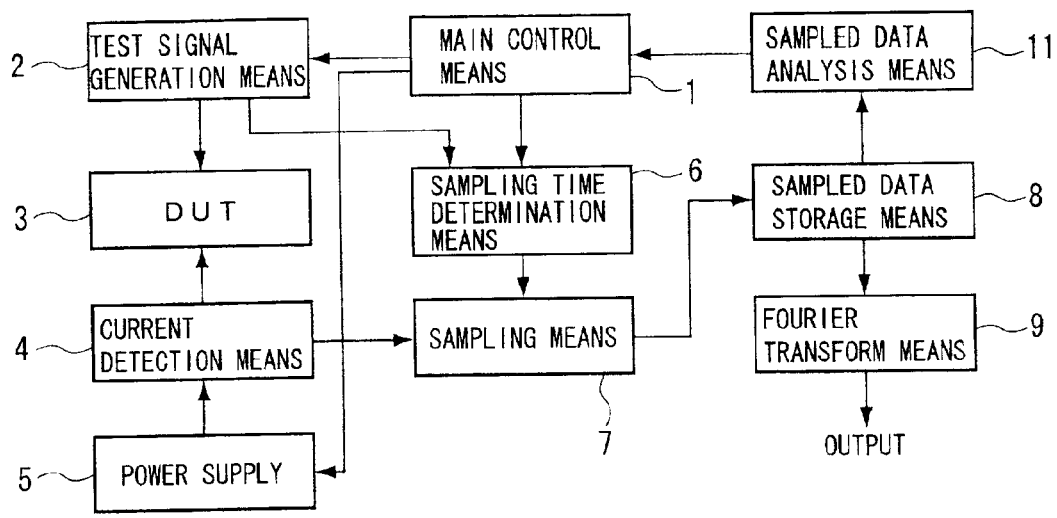
FIG. 3 is drawing showing a third embodiment of the present invention.

A third embodiment of the present invention is described below. FIG. 3 is a drawing showing the configuration of the third embodiment. Referring to FIG. 3, the third embodiment, compared with the first embodiment, has the new addition of a sampled data analysis means 11. The sampled data analysis means 11 analyzes the sampled power supply current data by the sampling means 7, determines the amount of time extension that should be made to the sampling of the power supply current value signal, and sends that value to the main control means 1.

Figure 13:
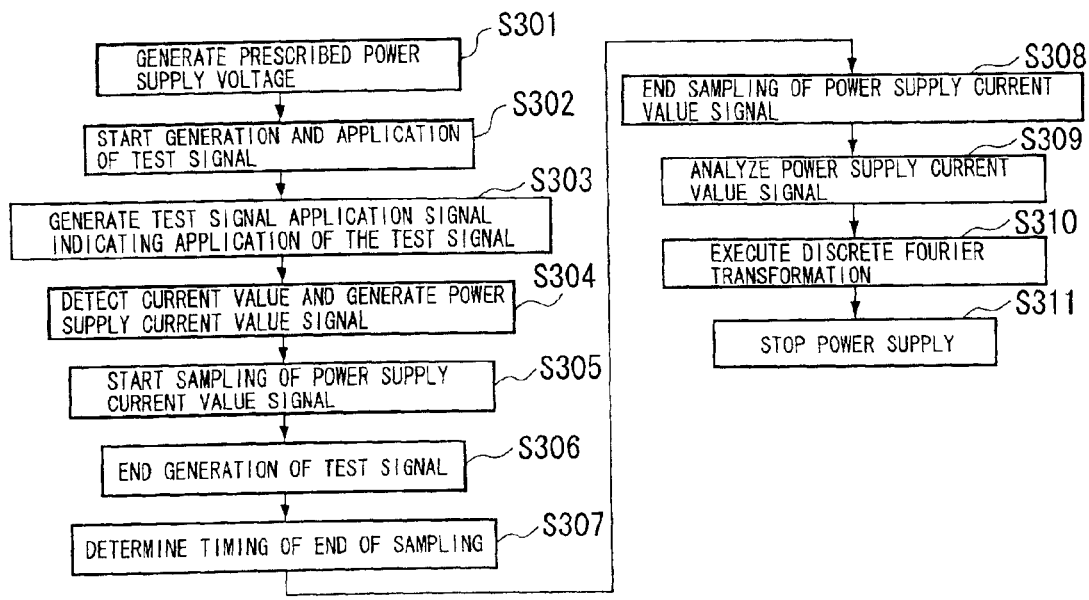
FIG. 13 is a flowchart showing the operation of the third embodiment of the present invention.

FIG. 13 is a flowchart showing the operation of the third embodiment of the present invention. In FIG. 13, steps S301 to S306, S308, S310 and S311 are the same as steps S101 to S106 and S108 to S110 shown in FIG. 9 with regard to the first embodiment, and are therefore not described herein.

The sampling time determination means 6, in response to the test signal application signal and an instruction from the main control means 1, issues an instruction to the sampling means 7 so as to stop the sampling at a time that is sufficiently delayed from the end of application of the test signal to the DUT 3 (step S307 in FIG. 13).

At the sampled data analysis means 11, the obtained sampled power supply current data is analyzed, and a determination is made as to how much sampling of the power supply current value signal should be done to be able to obtain accurate power supply current information, thereby determining the required delay time.

Once this time is determined, this information is sent by the main control means 1 to the sampling time determination means 6, so as to extend the sampling time by just the required amount of time, an instruction being accordingly issued to the sampling means 7 end the sampling (step S307 in FIG. 13).

In this case, the step S309 is not executed.

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The operational effect of the third embodiment of the present invention is as follows.

The sampling extension time for the sampling of the power supply current value signal is determined by the time constant of the circuitry formed by the power supply, the current detection means, and the DUT. If this time constant is not known with certainty, however, it is not known with certainty how much time the sampling should be extended to obtain accurate capture of the power supply current information. Given this, sampling is performed one time of the power supply current value signal over a sufficient amount of time and the sampled results are analyzed, so as to determine how much time the sampling should be extended in order to obtain accurate power supply current information. That is, in the third embodiment it is possible to reliably obtain power supply current information without knowing the precise time constant of the circuitry.

Figure 4:
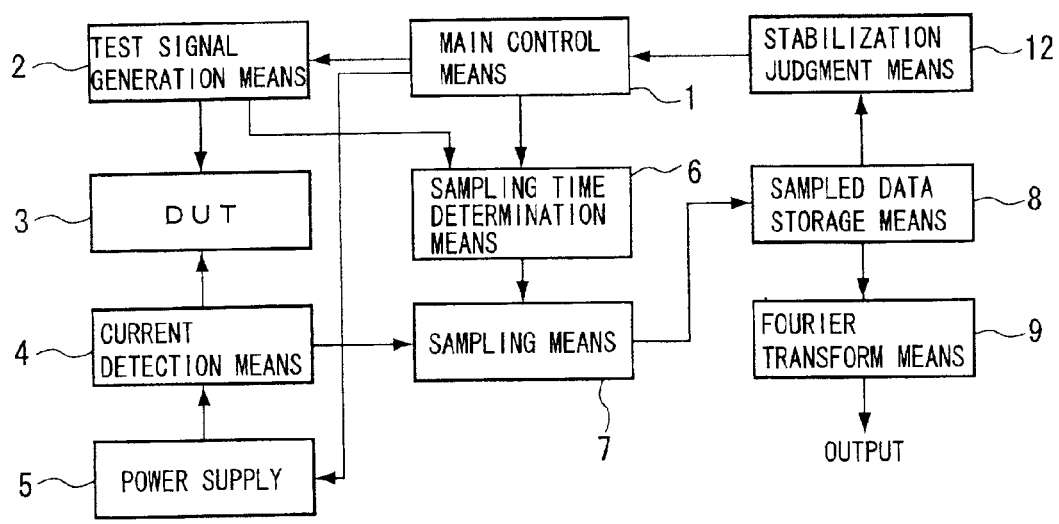
FIG. 4 is drawing showing a fourth embodiment of the present invention.

Next, a fourth embodiment of the present invention is described, with reference made to drawings. FIG. 4 is a drawing showing the configuration of the fourth embodiment. Referring to FIG. 4, the fourth embodiment, in comparison with the third embodiment, has, in place of the sampled data analysis means 11, a stabilization judgment means 12. The stabilization judgment means 12, from the results of sampling the power supply current value signal, analyzes how much time after the end of application of the test signal to the DUT 3 the power supply current stops or stabilizes. Other aspects of the configuration of this embodiment are the same as the third embodiment.

Figure 14:
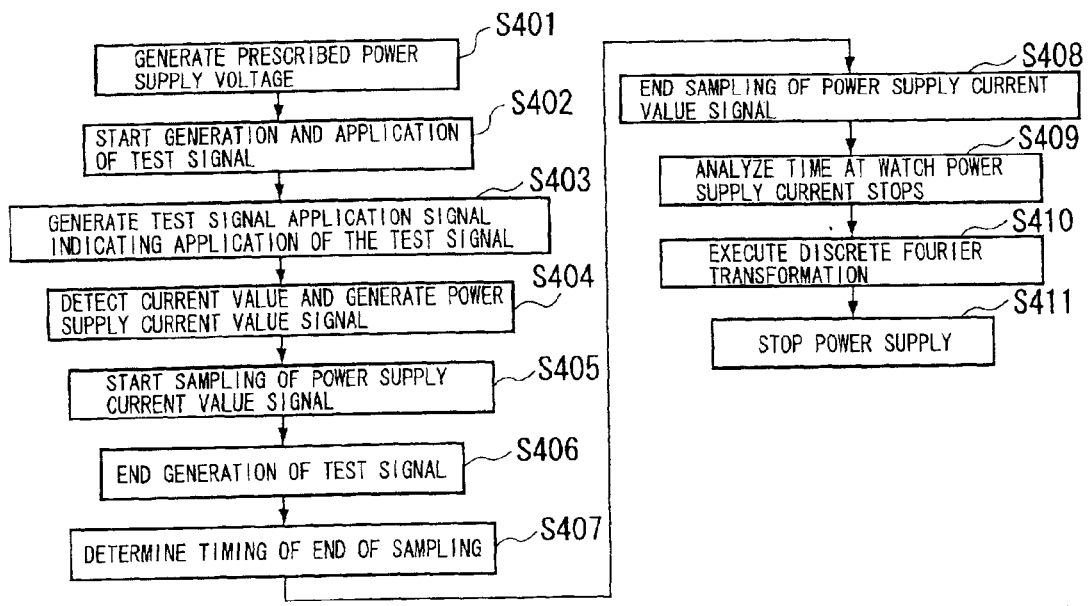
FIG. 14 is a flowchart showing the operation of the fourth embodiment of the present invention.

FIG. 14 is a flowchart showing the operation of the fourth embodiment of the present invention. In FIG. 14, the steps S401 to S408 and steps S410 to S411 are the same as the steps S301 to S308 and steps S310 to S311 in FIG. 13 with regard to the third embodiment, and will thus not be described herein.

The stabilization judgment means 12 analyzes the power supply current value signal sampled data stored in the sampled data storage means 8, and investigates how much time after the ending of application of the test signal from the test signal generation means 2 to the DUT 3 the power supply current stops or stabilizes. This time value is sent to the main control means 1 (step S409 in FIG. 14). After this time is determined one time, this information is sent from the main control means to the sampling time determination means 6, which issues an instruction to the sampling means 7 to extend the sampling time before stopping sampling the amount of time required (step S407 in FIG. 14). In this case, the step S409 of FIG. 14 is not executed.

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The operational effect of the fourth embodiment of the present invention is as follows.

The sampling extension time for the sampling of the power supply current value signal after ending of the application of the test signal to the DUT is determined by the time constant of the circuitry formed by the power supply, the current detection means, and the DUT. In the case in which this time constant is not known with certainty, however, it is not known with certainty how much time the sampling should be extended to obtain accurate capture of the power supply current information. Given this, sampling is performed one time of the power supply current value signal over a sufficient amount of time and the sampled results are analyzed, so as to determine how much time the sampling should be extended in order to obtain accurate power supply current information. That is, in the fourth embodiment, by extending the sampling by an amount of time so as to achieve stopping or stabilization of the power supply current, it is possible to reliably obtain power supply current information without knowing the precise time constant of the circuitry.

Figure 5:
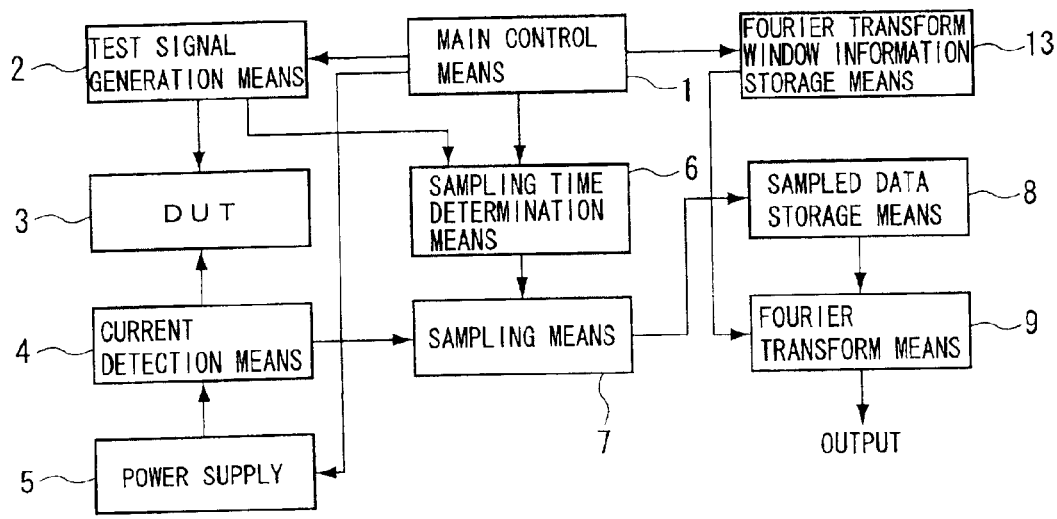
FIG. 5 is drawing showing a fifth embodiment of the present invention.

A fifth embodiment of the present invention is described below, with reference made drawings. FIG. 5 is a block diagram showing the configuration of the fifth embodiment. Referring to FIG. 5, the fifth embodiment of the present invention, in comparison with the configuration of the first embodiment shown in FIG. 1, has the addition of a Fourier transform window information storage means. Other aspects of the configuration are the same as the first embodiment.

The sampling time determination means 6 receives a test signal application signal from the test signal generation means 2 and issues an instruction to the sampling means to start the sampling of the power supply current value signal simultaneously with the start of the application of the test signal to the DUT 3, and issues an instruction to the sampling means 7 to end the sampling a sufficient time after the end of application of the test signal to the DUT 3.

The Fourier transform window information storage means 13 stores information about the range of data of the sampled power supply current value data stored in the sampled data storage means 8 to be subjected to a discrete Fourier transformation. This information is sent to the Fourier transform means 9, and when the discrete Fourier transformation is performed thereby, it is used to establish the range of data (window) used to transform the sampled data.

Figure 15:
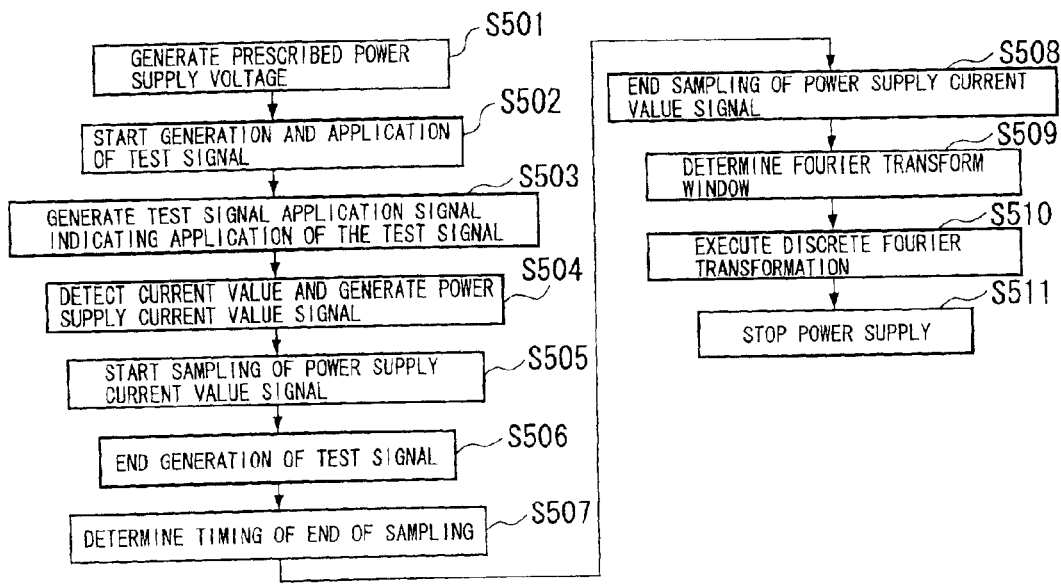
FIG. 15 is a flowchart showing the operation of the fifth embodiment of the present invention.

FIG. 15 is a flowchart showing the operation of the fifth embodiment of the present invention. In FIG. 15, steps S501 to S506, S508, S510, and S511 are the same as steps S101 to S106 and steps S108 to S110 of the first embodiment shown in FIG. 1, and are not described herein.

The sampling time determination means 6, based on the test signal application signal and an instruction from the main control means 1, issues an instruction to the sampling means 7 to end sampling at a point in time sufficiently after the end of application of the test signal (step S507 in FIG. 15).

The Fourier transform window information storage means 13 receives an instruction from the main control means 1, and issues an instruction to the Fourier transform means 9 regarding the range of sampled data to be subjected to the discrete Fourier transformation. This range (window) is established based on the characteristics of the circuitry formed by the power supply 5, the current detection means 4, and the DUT 3 (step S509 in FIG. 15).

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The operational effect of the fifth embodiment of the present invention is described below.

In order to reliably obtain power supply current information, the sampling delay time for sampling of the power supply current value signal after the end of application of the test signal to the DUT is determined in accordance with the time constant of circuitry formed by the power supply, the current detection means, and the DUT. For this reason, it is necessary to determine the ending time for sampling for each type of circuitry, the apparatus configuration being necessary such that sampling of the power supply current value signal is continued up to a differing ending time for each type of circuitry.

With the timing of ending of sampling fixed, extra sampling of the power supply current value signal is performed, and the subjecting of only a required range of the sampled data to a discrete Fourier transform is an issue concerned with Fourier transformation itself, this not requiring any particular apparatus configuration. That is, according to the fifth embodiment of the present invention, it is possible to achieve accurate power supply current information with a simpler apparatus configuration.

Figure 6:
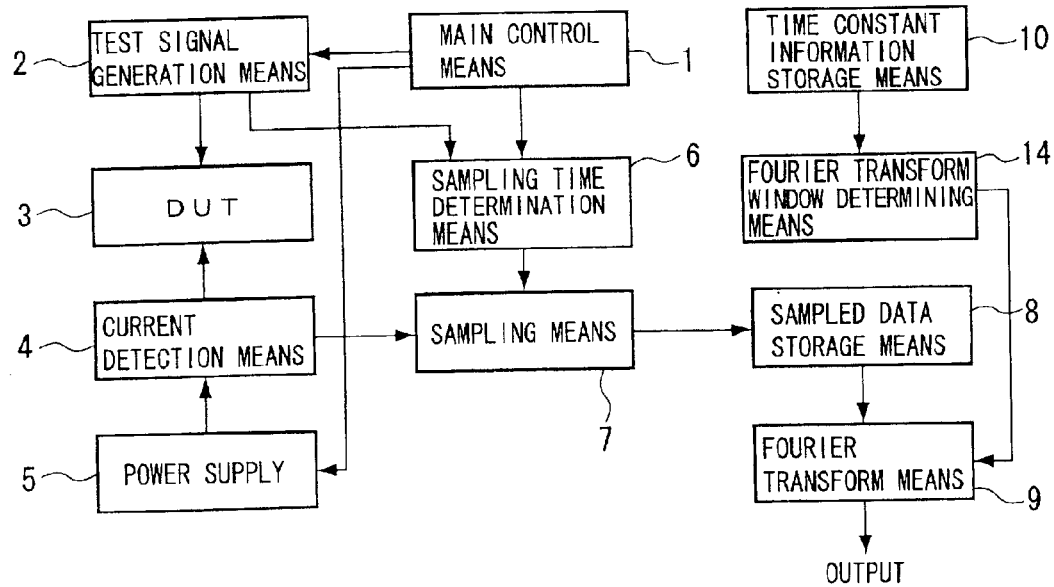
FIG. 6 is drawing showing a sixth embodiment of the present invention.

A sixth embodiment of the present invention is described below, with references made to drawings. FIG. 6 is a drawing showing the configuration of the sixth embodiment. Referring to FIG. 6, the sixth embodiment, in comparison to the fifth embodiment shown in FIG. 5, has a Fourier transform window determining means 14 in place of the Fourier transform window information storage means 13, and has the addition of a time constant information storage means 10.

The time constant information storage means 10 stores time constant information that represents the characteristics of the circuitry formed by the power supply 5, the current detection means 4, and the DUT 3.

The Fourier transform window determining means 14 receives time constant information from the time constant information storage means 10 and makes a judgment with regard to how much time after the end of application of the test signal to the DUT 3 is required for the power supply current flowing in the DUT 3 to stop or stabilize, and instructions the Fourier transform means 9, based on the results of that determination, the range (window) of data of the sampled power supply current value signal data to be subjected to a discrete Fourier transformation.

Figure 16:
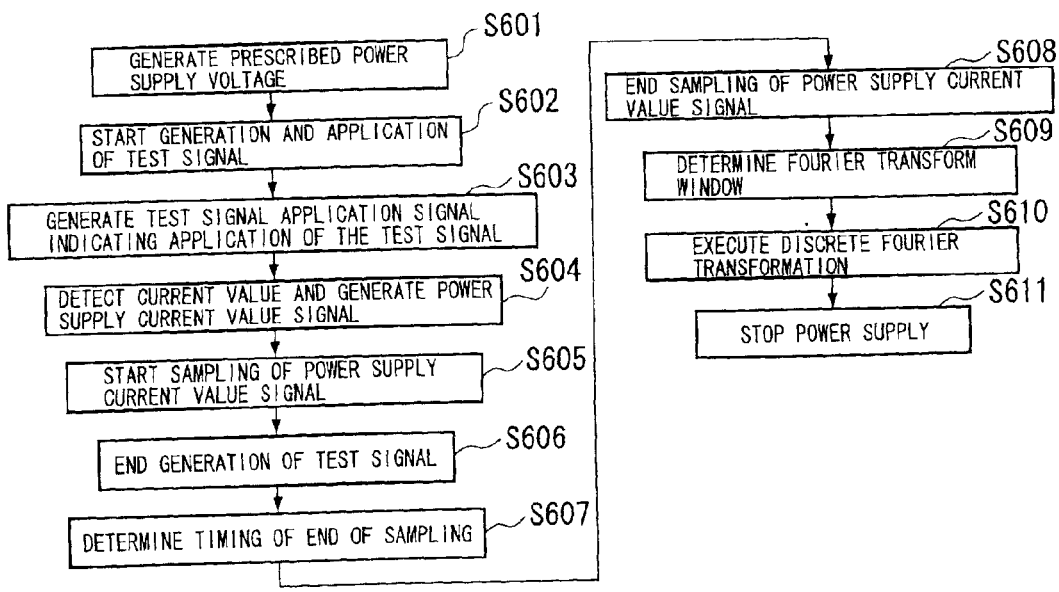
FIG. 16 is a flowchart showing the operation of the sixth embodiment of the present invention.

FIG. 16 is a flowchart showing the operation of the sixth embodiment of the present invention. In FIG. 16, steps S601 to S608, S610, and S611 are the same as steps S501 to S508, S510, and S511 in the fifth embodiment, and are thus not described herein.

The Fourier transform window determining means 14, based on information from the time constant information storage means 10, determines the range of sampled data of the results of sampling the power supply current value to be subjected to a Fourier transformation, and sends this value to the Fourier transform means 8 (step S609 in FIG. 16).

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The sixth embodiment of the present invention achieve the effects of both the second embodiment and the fifth embodiment.

Figure 7:
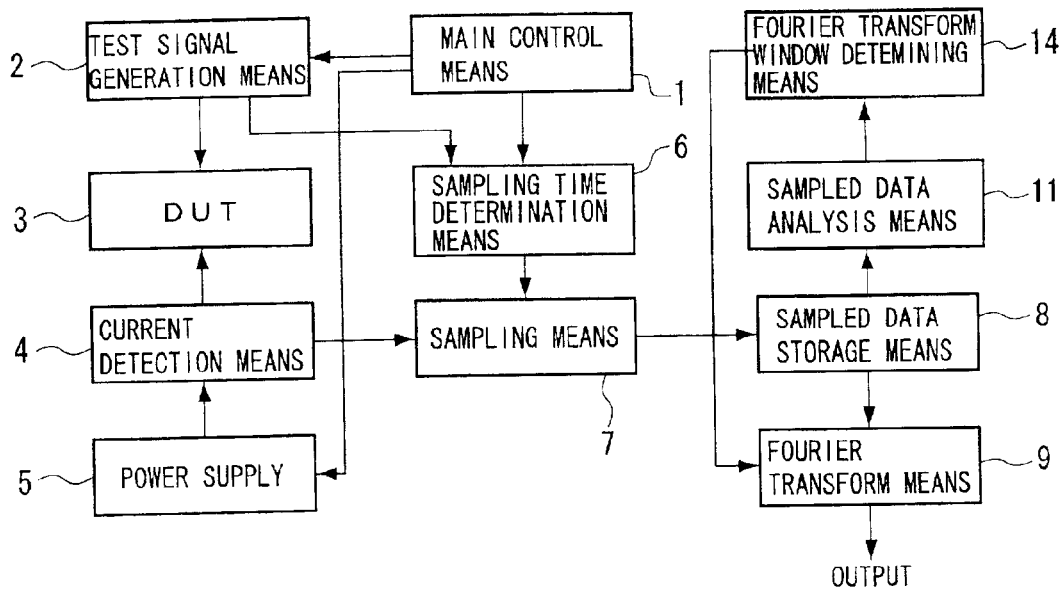
FIG. 7 is drawing showing a seventh embodiment of the present invention.

A seventh embodiment of the present invention is described below, with references made to drawings. FIG. 7 is a drawing showing the configuration of the seventh embodiment. Referring to FIG. 7, the seventh embodiment, in comparison to the fifth embodiment, has a sampled data analysis means 11 in place of the Fourier transform window information storage means 13, and has the addition of a Fourier transform window determining means 14.

The sampled data analysis means 11 analyzes the sampled power supply current data by the sampling means 7, and determines the amount of time extension that should be made to the sampling of the power supply current value signal to obtain accurate power supply current information. The thus determined sampling extension time is send to the Fourier transform window determining means 14, which issues an instruction to the Fourier transform means 9 with regard to a sampling range (window) to be subjected to a Fourier transformation, in correspondence to this extension time.

Figure 17:
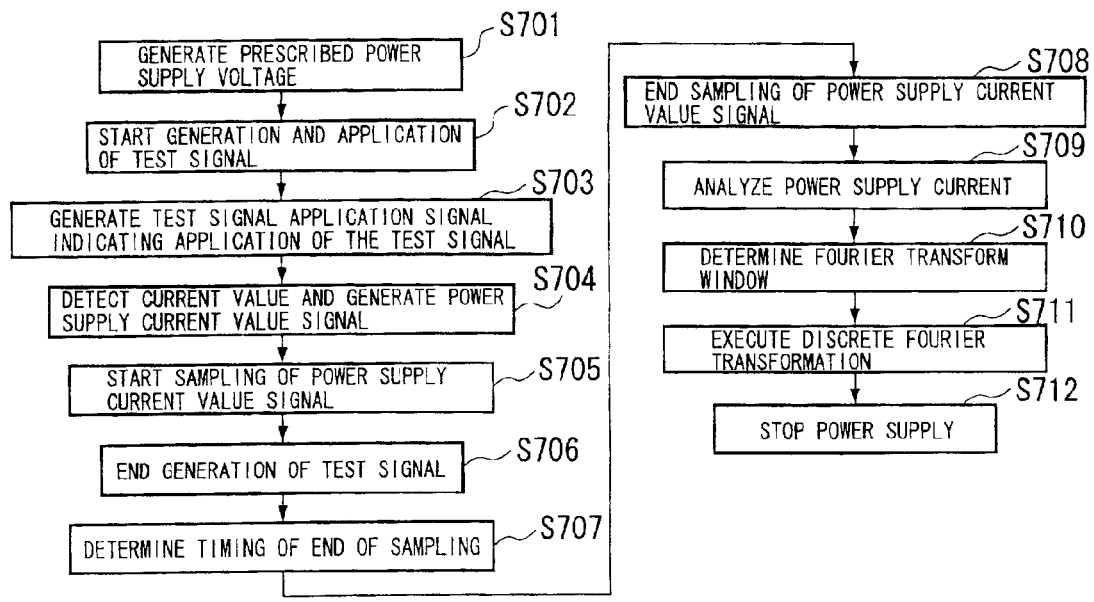
FIG. 17 is a flowchart showing the operation of the seventh embodiment of the present invention.

FIG. 17 is a flowchart showing the operation of the seventh embodiment. In FIG. 17, the steps S701 to S708 and S711 to S712 are the same as steps S501 to S508, S510, and S511 in the fifth embodiment, and are thus not described herein.

In the sampled data analysis means 11, a check is made of the sampled data for the power supply current value signal stored in the sampled data storage means 8, and a judgment is made with regard to how much time after the end of application of the test signal to the DUT 3 the sampling should be continued in order to obtain accurate power supply current information, this range being sent to the Fourier transform window determining means 14 (step S709 in FIG. 17).

The Fourier transform window determining means 14 determines, of the sampled data of the power supply current value signal, the range of sampled data to be subjected to a Fourier transformation, and sends that data range to the Fourier transform means 9 (step S710 in FIG. 17).

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The operational effect of the seventh embodiment of the present invention includes the effect of the third embodiment and the effect of the fifth embodiment of the present invention.

Figure 8:
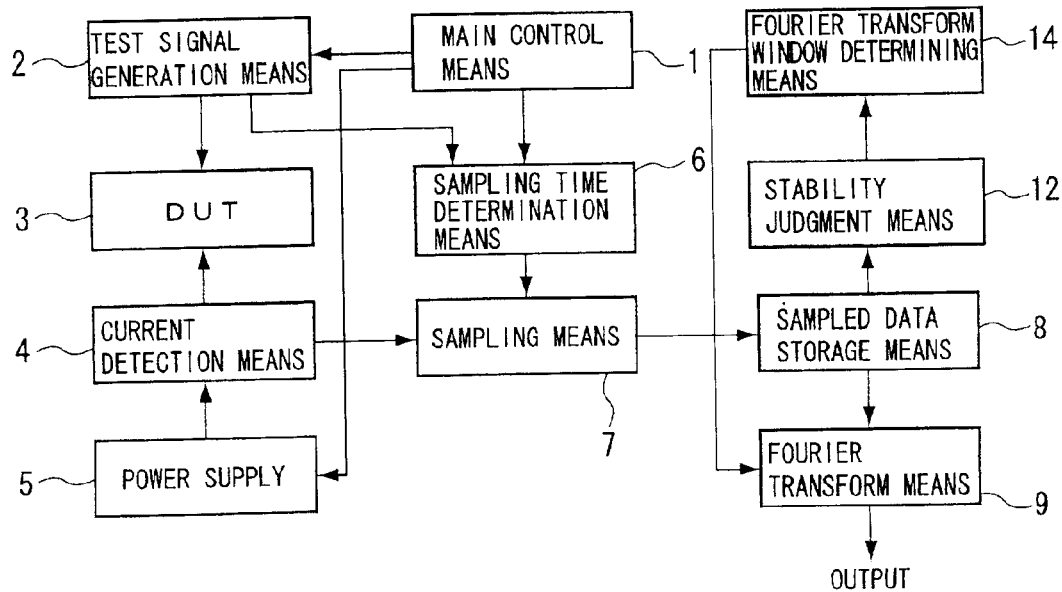
FIG. 8 is drawing showing a eighth embodiment of the present invention.

An eighth embodiment of the present invention is described below, with references made to drawings. FIG. 8 is a drawing showing the configuration of the eighth embodiment. Referring to FIG. 8, the eighth embodiment, in comparison with the seventh embodiment, has a stabilization judgment means 12 in place of the sampled data analysis means 11.

In the stabilization judgment means 12, a check is made as to how much time after the end of application of the test signal to the DUT 3 is required for the power supply current to either stop or stabilize, this time being calculated. The result is sent to the Fourier transform window determining means 14.

Figure 18:
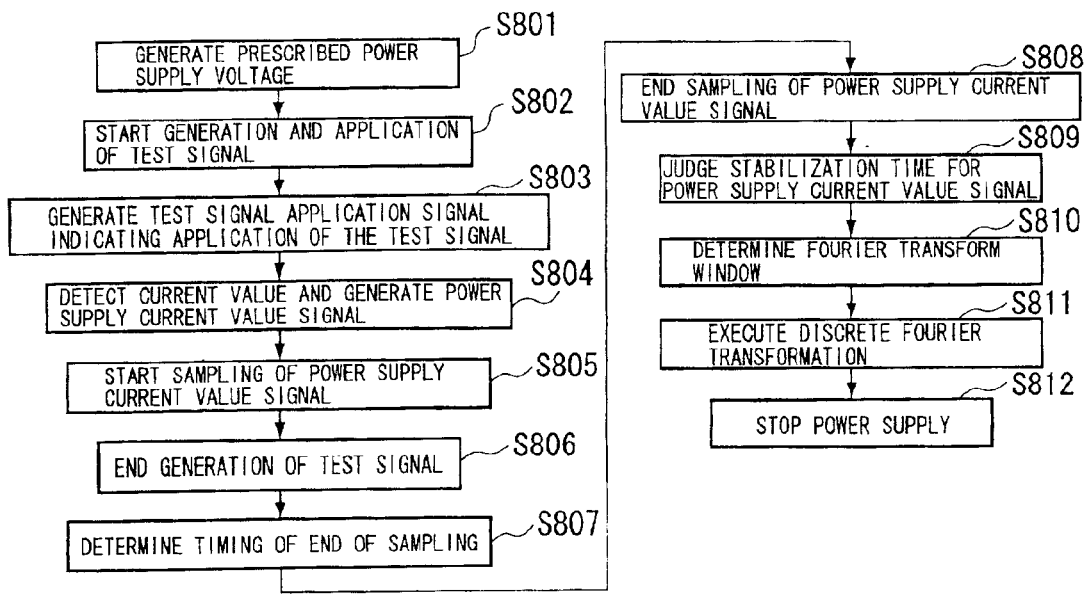
FIG. 18 is a flowchart showing the operation of the eighth embodiment of the present invention.

FIG. 18 is a flowchart showing the operation of the eighth embodiment of the present invention. In FIG. 18, the steps S801 to S808 and S810 to S812 are the same as steps S701 to S708 and S710 to S712 in the seventh embodiment, and are thus not described herein.

In the stabilization judgment means 12, the sampled data storage means 8 is accessed, the sampled power supply current value signal sampled by the sampling means 7 is received, and an analysis is performed. What is analyzed is how much time after the end of application of the test signal to the DUT 3 is required for the power supply current detected by the current detection means 4 to either stop or stabilize, this time being calculated. This result is sent to the Fourier transform window determining means 14 (step S809 in FIG. 18).

This series of operations can be coded as a control program of the related control operations, which is executed by the main control means 1, thereby controlling the operation of various sections of the apparatus. In this case, the control program is stored into a storage medium (not shown in the drawing) such as a ROM or floppy disk attached to the main control means 1, this program being then loaded into the main control means.

The effect of the eighth embodiment of the present invention is the combination of the effects of the fourth embodiment and the fifth embodiment of the present invention.

As described in detail above, according to the present invention, it is possible to obtain more accurately the behavior of (information with regard to) to the power supply current flowing in a DUT to which a test signal is applied. The reasons for this are as follows.

Specifically, there is a time constant in the circuitry formed by the power supply, the current detection means, and even after the application of the test signal to the DUT ends, power supply current flows for some time, so that it is not possible by merely observing the power supply current from the start to the stop of application of the test signal to the DUT to obtain a complete grasp of the behavior of the power supply current, the observation of the power supply current after the end of application of the test signal making it possible to obtain a grasp of the complete power supply current behavior.

That is, in the present invention by obtaining and analyzing the power supply current information after the end of application of the test signal to the DUT 3 for a pre-established amount of time, an amount of time responsive to the time constant of the circuitry, or an amount of time obtained by an actual measurement of the power supply current, it is possible to obtain more accurate power supply current information.

What is claimed is:

1. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a pre-established amount of time has elapsed after the end of application of said test signal to said integrated circuit; and (g) performing a Fourier transformation on all data obtained by said sampling, and obtaining a frequency spectrum of said power supply current value signal.

2. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when an amount of extension time determined from a circuit time constant information, has elapsed after the end of application of said test signal to said integrated circuit; and (g) performing a Fourier transformation on all data obtained by said sampling, and obtaining a frequency spectrum of said power supply current value signal.

3. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit;

(g) performing a Fourier transformation on all data obtained by said sampling, and obtaining a frequency spectrum of said power supply current value signal; and (h) analyzing all data obtained by said sampling, determining a range to which said Fourier analysis should be applied, and determining a sampling extension time after ending application of said test signal to said integrated circuit.

4. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit;

(g) performing a Fourier transformation on all data obtained by said sampling, and obtaining a frequency spectrum of said power supply current value signal; and (h) analyzing all data obtained by said sampling, determining an amount of time after ending application of said test signal to said integrated circuit at which said power supply current stops or stabilizes, and determining a sampling extension time after ending the application of said test signal to said integrated circuit.

5. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit; and (g) performing a Fourier transformation on a pre-established range of all the data obtained by said sampling, and obtaining a frequency spectrum of said power supply current value signal.

6. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit; and (g) determining a range of data of all the data obtained by said sampling, to which a Fourier transformation should be applied based on a circuit time constant information, performing said Fourier transformation on said range of data, and obtaining a frequency spectrum of the power supply current value signal.

7. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit; and (g) analyzing all data obtained by said sampling, determining a range of data to be subjected to a discrete Fourier transformation, performing a Fourier transformation on said range of data, and obtaining a frequency spectrum of said power supply current value signal.

8. A method for sampling a power supply current value for frequency analysis of the power supply current flowing in an integrated circuit when a test signal is applied to said integrated circuit, comprising steps of:

(a) starting generation of a pre-established voltage and applying a power supply voltage to a power supply terminal of said integrated circuit;

(b) starting generation of a test signal, and starting application of said test signal to an input/output terminal other than a power supply terminal of said integrated circuit;

(c) generating a test signal application signal indicating application of said test signal along with the start of the application of said test signal;

(d) observing a value of a power supply current supplied to said integrated circuit, and generating a power supply current value signal indicating said power supply current value;

(e) starting sampling of said power supply current value signal simultaneously with the start of the application of said test signal to said integrated circuit;

(f) ending sampling of said power supply current value signal when a sufficient time has elapsed after the end of application of said test signal to said integrated circuit; and (g) analyzing all data obtained by said sampling, determining a range of data to be subjected to a Fourier transformation based on a period from a time after when said application of said test signal to said integrated circuit had been stopped to a time when said power supply current stops or stabilizes, performing a Fourier transformation on said data range, and obtaining a frequency spectrum of said power supply current value signal.

9. A method for sampling a power supply current value of an integrated circuit according to claim 1, wherein a discrete Fourier transformation is used as said Fourier transformation.

10. An apparatus for sampling a power supply current value for analyzing frequency of the power supply current flowing in an integrated circuit when a test signal is applied to the integrated circuit, comprising:

means for generating a prescribed power supply to be supplied to a power supply terminal of an integrated circuit under test (DUT: device under test);

a current detecting means for observing a power supply current value supplied to the DUT and for generating a power supply current value signal indicating said value thus observed;

a test signal generating means for generating a prescribed test signal to be applied to an input/output terminal other than a power supply terminal of said DUT and for generating a test signal application signal indicating the application of said test signal;

a sampling means for sampling said power supply current value signal;

a sampling time determining means for instructing said sampling means, based on said test signal application signal, to start and end sampling;

a sampling data storing means for storing data sampled by said sampling means;

means for performing a Fourier transformation on said sampled data; and main control means for outputting an instruction to various said means and performing overall apparatus control;

and further wherein said sampling time determining means indicates a time for ending the sampling based upon a detection of a pre-established amount of time having elapsed after the end of application of said test signal to said integrated circuit.

11. A power supply current value sampling apparatus according to claim 10, further comprising a time constant information storage means for storing time constant information of a circuit, wherein said sampling time determining means, based on said test signal application signal and said time constant information of said time constant information storage means, issues an instruction to said sampling means to start and end said sampling.

12. A power supply current value sampling apparatus of said integrated circuit according to claim 10, further comprising a sampling data analysis means for analyzing said sampled data, and for determining a continuation time for sampling said power supply current value signal after the end of the application of said test signal to said DUT.

13. A power supply current value sampling apparatus of said integrated circuit according to claim 10, further comprising a stabilization judgment means for judging how many times would be required before said power supply current stops or stabilizes, after ending of the application of said test signal to said DUT, based on said sampled data, and for determining an extension time for said sampling.

14. A power supply current value sampling apparatus of said integrated circuit according to claim 10, further comprising a Fourier transform window information storage means for storage a range of data of said sampled data to be subjected to a Fourier transformation.

15. A power supply current value sampling apparatus of said integrated circuit according to claim 10, further comprising:

a time constant information storage means for holding circuit time constant information; and a Fourier transform window determining means for determining, based on said time constant information, a range of said sampled data to be subjected to a Fourier transformation.

16. A power supply current value sampling apparatus of said integrated circuit according to claim 10, further comprising a sampling data analysis means for analyzing said sampled data; and a Fourier transform window determining means for determining, from results of said sampled data analysis means, a range of sampled data to be subjected to a Fourier transformation, among said sampled data.

17. A power supply current value sampling apparatus of said integrated circuit according to claim 10, further comprising:

a stabilization judgment means for analysing how many times would be required after the ending of application of said test signal to said DUT until a time when said power supply current is stopped or stabilized; and a Fourier transform window determining means for determining a range of data of said sampled data to be subjected to a Fourier transformation, based on the results of said stabilization judgment means.

18. An power supply current value sampling apparatus of said integrated circuit according to claim 10, wherein said Fourier transform means uses a discrete Fourier transformation.

19. A storage medium for storing a program for execution of the following process by a computer in a power supply current value sampling apparatus for performing frequency analysis of a power supply current flowing in an integrated circuit with a test signal applied to said integrated circuit, said process comprising the steps of;

(a) processing for starting generation of a pre-established voltage and applying said power supply voltage to a power supply terminal of said DUT;

(b) processing for causing a current detection means to observe a size of a power supply current supplied to said DUT from said power supply and to generate a power supply current value signal indicating said value;

(c) processing for causing a test signal generating means to generate a prescribed test signal, and to apply said test signal to an input/output terminal of said DUT and to generate a test signal application signal indicating that said test signal is being applied;

(d) processing for determining a timing of a start and an end of sampling of said power supply current value based on said test signal application signal, and for outputting of an instruction to a sampling means;

(e) processing for causing said sampling means, based on said timing of the start and end of the sampling, to execute said sampling of said power supply current value signal and wherein when a timing for ending the sampling should be determined, it is determined by detecting a pre-established amount of time having elapsed after the end of application of said test signal to said integrated circuit;

(f) processing for causing said sampled data storing means to store said sampled data of said power supply current value signals obtained from said sampling; and (g) processing for causing a Fourier transformation means to perform the Fourier transforming processing on said sampled data, and to determine a frequency spectrum of said power supply current.

20. A storage medium according to claim 19, wherein said Fourier transform means performs a discrete Fourier transformation.

21. A storage medium for storing a program for execution of the following process by a computer in a power supply current value sampling apparatus for performing frequency analysis of a power supply current flowing in an integrated circuit with a test signal applied to said integrated circuit, said process comprising the steps of;

(h) processing for causing a time constant information storage means to record circuit time constant information;

(a) processing for starting generation of a pre-established voltage and applying said power supply voltage to a power supply terminal of said DUT;

(b) processing for causing a current detection means to observe a size of a power supply current supplied to said DUT from said power supply and to generate a power supply current value signal indicating said value;

(c) processing for causing a test signal generating means to generate a prescribed test signal, and to apply said test signal to an input/output terminal of said DUT and to generate a test signal application signal indicating that said test signal is being applied;

(d) processing for determining a timing of a start and an end of sampling of said power supply current value based on said test signal application signal and said time constant information, and for outputting of an instruction to a sampling means;

(e) processing for causing said sampling means, based on said timing of the start and end of the sampling, to execute said sampling of said power supply current value signal;

(f) processing for causing said sampled data storing means to store said sampled data of said power supply current value signals obtained from said sampling; and (g) processing for causing a Fourier transformation means to perform the Fourier transforming processing on said sampled data, and to determine a frequency spectrum of said power supply current.

22. A storage medium for storing a program for execution of the following process by a computer in a power supply current value sampling apparatus for performing frequency analysis of a power supply current flowing in an integrated circuit with a test signal applied to said integrated circuit, said process comprising the steps of;

(i) processing for analyzing sampled data;

(a) processing for starting generation of a pre-established voltage and applying said power supply voltage to a power supply terminal of said DUT;

(b) processing for causing a current detection means to observe a size of a power supply current supplied to said DUT from said power supply and to generate a power supply current value signal indicating said value;

(c) processing for causing a test signal generating means to generate a prescribed test signal, and to apply said test signal to an input/output terminal of said DUT and to generate a test signal application signal indicating that said test signal is being applied;

(d) processing for determining a timing of a start and an end of sampling of said power supply current value based on said test signal application signal and the results of said analysing said sampled data, and for outputting of an instruction to a sampling means;

(e) processing for causing said sampling means, based on said timing of the start and end of the sampling, to execute said sampling of said power supply current value signal;

(f) processing for causing said sampled data storing means to store said sampled data of said power supply current value signals obtained from said sampling; and (g) processing for causing a Fourier transformation means to perform the Fourier transforming processing on said sampled data, and to determine a frequency spectrum of said power supply current.

23. A storage medium for storing a program for execution of the following process by a computer in a power supply current value sampling apparatus for performing frequency analysis of a power supply current flowing in an integrated circuit with a test signal applied to said integrated circuit, said process comprising the steps of;
   (i) processing for analyzing how much time would be required after ending application of said test signal to said DUT until said power supply current stops or stabilizes;
   (a) processing for starting generation of a pre-established voltage and applying said power supply voltage to a power supply terminal of said DUT;
   (b) processing for causing a current detection means to observe a size of a power supply current supplied to said DUT from said power supply and to generate a power supply current value signal indicating said value;
   (c) processing for causing a test signal generating means to generate a prescribed test signal, and to apply said test signal to an input/output terminal of said DUT and to generate a test signal application signal indicating that said test signal is being applied;
   (d) processing for determining a timing of a start and an end of sampling of said power supply current value based on said test signal application signal and the results of the analysis of how much time would be required after ending application of said test signal to said DUT until said power supply current stops or stabilizes, and for outputting of an instruction to a sampling means;
   (e) processing for causing said sampling means, based on said timing of the start and end of the sampling, to execute said sampling of said power supply current value signal;
   (f) processing for causing said sampled data storing means to store said sampled data of said power supply current value signals obtained from said sampling; and
   (g) processing for causing a Fourier transformation means to perform the Fourier transforming processing on said sampled data, and to determine a frequency spectrum of said power supply current.

24. A storage medium for storing a program for execution of the following process by a computer in a power supply current value sampling apparatus for performing frequency analysis of a power supply current flowing in an integrated circuit with a test signal applied to said integrated circuit, said process comprising the steps of;
   (j) processing for causing output of a range of data to be subjected to a Fourier transformation;
   (a) processing for starting generation of a pre-established voltage and applying said power supply voltage to a power supply terminal of said DUT;
   (b) processing for causing a current detection means to observe a size of a power supply current supplied to said DUT from said power supply and to generate a power supply current value signal indicating said value;
   (c) processing for causing a test signal generating means to generate a prescribed test signal, and to apply said test signal to an input/output terminal of said DUT and to generate a test signal application signal indicating that said test signal is being applied;
   (d) processing for determining a timing of a start and an end of sampling of said power supply current value based on said test signal application signal, and for outputting of an instruction to a sampling means;
   (e) processing for causing said sampling means, based on said timing of the start and end of the sampling, to execute said sampling of said power supply current value signal;
   (f) processing for causing said sampled data storing means to store said sampled data of said power supply current value signals obtained from said sampling; and
   (g) processing for causing a Fourier transformation means to perform the Fourier transforming processing on said sampled data within said range as indicated by said data range among said sampled data, and to determine a frequency spectrum of said power supply current.

25. A storage medium for storing a program for execution of the following process by a computer in a power supply current value sampling apparatus for performing frequency analysis of a power supply current flowing in an integrated circuit with a test signal applied to said integrated circuit, said process comprising the steps of;
   (k) processing for storing circuit time constant information into a time constant information storage means;
   (l) processing for determining a range of sampled data to be subjected to a Fourier transformation, based on said time constant information;
   (a) processing for starting generation of a pre-established voltage and applying said power supply voltage to a power supply terminal of said DUT;
   (b) processing for causing a current detection means to observe a size of a power supply current supplied to said DUT from said power supply and to generate a power supply current value signal indicating said value;
   (c) processing for causing a test signal generating means to generate a prescribed test signal, and to apply said test signal to an input/output terminal of said DUT and to generate a test signal application signal indicating that said test signal is being applied;
   (d) processing for determining a timing of a start and an end of sampling of said power supply current value based on said test signal application signal, and for outputting of an instruction to a sampling means;
   (e) processing for causing said sampling means, based on said timing of the start and end of the sampling, to execute said sampling of said power supply current value signal;
   (f) processing for causing said sampled data storing means to store said sampled data of said power supply current value signals obtained from said sampling; and
   (g) processing for causing a Fourier transformation means to perform the Fourier transforming processing on said sampled data within said range as indicated by said data range among said sampled data, and to determine a frequency spectrum of said power supply current.

26. A storage medium for storing a program for execution of the following process by a computer in a power supply current value sampling apparatus for performing frequency analysis of a power supply current flowing in an integrated circuit with a test signal applied to said integrated circuit, said process comprising the steps of;
   (m) processing for analyzing sampled data;
   (n) processing for determining a range of sampled data to be subjected to a Fourier transformation, based on a result of said sampled data analysis;

(a) processing for starting generation of a pre-established voltage and applying said power supply voltage to a power supply terminal of said DUT;

(b) processing for causing a current detection means to observe a size of a power supply current supplied to said DUT from said power supply and to generate a power supply current value signal indicating said value;

(c) processing for causing a test signal generating means to generate a prescribed test signal, and to apply said test signal to an input/output terminal of said DUT and to generate a test signal application signal indicating that said test signal is being applied;

(d) processing for determining a timing of a start and an end of sampling of said power supply current value based on said test signal application signal, and for outputting of an instruction to a sampling means;

(e) processing for causing said sampling means, based on said timing of the start and end of the sampling, to execute said sampling of said power supply current value signal;

(f) processing for causing said sampled data storing means to store said sampled data of said power supply current value signals obtained from said sampling; and (g) processing for causing a Fourier transformation means to perform a discrete Fourier transforming processing on said sampled data within said range as indicated by said data range among said sampled data, and to determine a frequency spectrum of said power supply current.

27. A storage medium for storing a program for execution of the following process by a computer in a power supply current value sampling apparatus for performing frequency analysis of a power supply current flowing in an integrated circuit with a test signal applied to said integrated circuit, said process comprising the steps of;

(m) processing for performing a stabilization judgment, by analyzing sampled data, and investigating an amount of time after the end of application of a test signal to said DUT until a time when said power supply current stops or stabilizes;

(n) processing for determining a range of sampled data to be subjected to a Fourier transformation, based on a result of said stabilization judgment processing;

(a) processing for starting generation of a pre-established voltage and applying said power supply voltage to a power supply terminal of said DUT;

(b) processing for causing a current detection means to observe a size of a power supply current supplied to said DUT from said power supply and to generate a power supply current value signal indicating said value;

(c) processing for causing a test signal generating means to generate a prescribed test signal, and to apply said test signal to an input/output terminal of said DUT and to generate a test signal application signal indicating that said test signal is being applied;

(d) processing for determining a timing of a start and an end of sampling of said power supply current value based on said test signal application signal, and for outputting of an instruction to a sampling means;

(e) processing for causing said sampling means, based on said timing of the start and end of the sampling, to execute said sampling of said power supply current value signal;

(f) processing for causing said sampled data storing means to store said sampled data of said power supply current value signals obtained from said sampling; and (g) processing for causing a Fourier transformation means to perform the Fourier transforming processing on said sampled data within said range as indicated by said data range among said sampled data, and to determine a frequency spectrum of said power supply current.

28. A sampling method for sampling and analyzing a power supply current flowing in a device under device with a test pattern applied to said device under test, whereby even after the end of application of said test pattern to said device under test, said sampling is continued by a time selected from a predetermined time, a time responsive to the circuitry time constant of said circuitry and an amount of time obtained by analyzing the power supply current value by actual measurement, and whereby frequency analysis is performed on the obtained power supply current information.

29. A sampling apparatus for applying a test pattern to a device under test and sampling and analyzing a power supply current flowing in a device under device, wherein said apparatus is further provided with a means for continuing said sampling operation even after the end of application of said test pattern to said device under test, by a time selected from a predetermined time, a time responsive to the circuitry time constant of said circuitry and an amount of time obtained by analyzing the power supply current value by actual measurement, whereby frequency analysis is performed of the obtained power supply current information.

* * * * *